United States Patent
Kondo

(10) Patent No.: US 9,871,027 B2
(45) Date of Patent: Jan. 16, 2018

(54) SEMICONDUCTOR DEVICE HAVING MESH-PATTERNED WIRINGS

(71) Applicant: SOCIONEXT INC., Yokohama-shi, Kanagawa (JP)

(72) Inventor: Eiji Kondo, Kawasaki (JP)

(73) Assignee: SOCIONEXT INC., Yokohama (JP)

(*) Notice: Subject to any disclaimer, the term of this patent is extended or adjusted under 35 U.S.C. 154(b) by 14 days.

(21) Appl. No.: 14/821,187

(22) Filed: Aug. 7, 2015

(65) Prior Publication Data
US 2016/0064369 A1   Mar. 3, 2016

(30) Foreign Application Priority Data
Sep. 2, 2014  (JP) .................................. 2014-178040

(51) Int. Cl.
| | |
|---|---|
| H01L 27/02 | (2006.01) |
| G11C 5/14 | (2006.01) |
| H01L 23/528 | (2006.01) |
| H01L 23/522 | (2006.01) |
| H01L 27/092 | (2006.01) |

(52) U.S. Cl.
CPC ............ *H01L 27/0207* (2013.01); *G11C 5/14* (2013.01); *G11C 5/146* (2013.01); *H01L 23/5286* (2013.01); *H01L 23/5226* (2013.01); *H01L 27/092* (2013.01); *H01L 2924/0002* (2013.01)

(58) Field of Classification Search
CPC ............ H01L 27/0207; H01L 23/5286; H01L 23/5226; H01L 27/092; H01L 2924/0002; H01L 2924/00; G11C 5/14; G11C 5/146
See application file for complete search history.

(56) References Cited

U.S. PATENT DOCUMENTS

| | | | | |
|---|---|---|---|---|
| 6,127,845 A | * | 10/2000 | Kolze | H01L 27/11807 257/E21.625 |
| 6,734,472 B2 | * | 5/2004 | Ho | H01L 23/5225 208/211 |
| 7,073,147 B2 | * | 7/2006 | Ikeda | G11C 5/14 257/E27.098 |
| 7,274,210 B2 | * | 9/2007 | Ogata | H01L 27/0203 257/207 |
| 7,346,869 B2 | * | 3/2008 | Tai | G06F 17/5068 716/111 |

(Continued)

FOREIGN PATENT DOCUMENTS

| | | |
|---|---|---|
| JP | 63-153852 A | 6/1988 |
| JP | 2006-351633 A | 12/2006 |
| JP | 2013-258266 A | 12/2013 |

*Primary Examiner* — Vanthu Nguyen
(74) *Attorney, Agent, or Firm* — Arent Fox LLP

(57) ABSTRACT

A semiconductor device includes a mesh-patterned power source wiring that supplies respective circuits with a power source voltage supplied to a plurality of locations at an outer periphery of the semiconductor device. The semiconductor device also includes a back-biasing wiring supplying, to a semiconductor substrate, a substrate voltage that controls a threshold voltage of a semiconductor element. The back-biasing wiring includes a upper layer mesh wiring that receives a supply of a substrate voltage, and a lower layer mesh wiring that is provided in a different wiring layer from the upper layer mesh wiring. The outer peripheries of the upper layer mesh wiring and the lower layer mesh wiring are connected to each other through plural vias.

9 Claims, 19 Drawing Sheets

(56) References Cited

U.S. PATENT DOCUMENTS

| | | | |
|---|---|---|---|
| 7,612,604 B2* | 11/2009 | Miyazaki | H01L 27/0928 327/534 |
| 7,768,334 B2* | 8/2010 | Yamane | G06F 1/10 327/297 |
| 7,943,436 B2* | 5/2011 | McElvain | G06F 17/5077 257/659 |
| 8,299,818 B2* | 10/2012 | Ogata | H01L 23/5286 257/207 |
| 8,443,306 B1* | 5/2013 | Dhong | H01L 27/11807 257/206 |
| 8,701,068 B2* | 4/2014 | McElvain | G06F 17/5077 257/409 |
| 2006/0239102 A1* | 10/2006 | Saita | H01L 23/5286 365/226 |
| 2006/0285418 A1 | 12/2006 | Aoki | |

* cited by examiner

SEMICONDUCTOR DEVICE HAVING MESH-PATTERNED WIRINGS

CROSS-REFERENCE TO RELATED APPLICATION

This application is based upon and claims the benefit of priority of the prior Japanese Patent Application No. 2014-178040, filed on Sep. 2, 2014, the entire contents of which are incorporated herein by reference.

FIELD

The embodiments discussed herein are related to a semiconductor device.

BACKGROUND

Technology is known that controls the threshold voltage of a transistor by applying a bias voltage (referred to as a back-biasing voltage hereafter) to a semiconductor substrate. Shifting the threshold voltage of a transistor to the high side enables leak current to be suppressed, and power consumption to be reduced.

A known semiconductor device includes a back gate bias circuit that biases the back gate regions of plural MOS transistors, and plural metal wires that are wires that connect small segments of back gate regions to each other, and that are disposed independently from one another. In this semiconductor device, the plural metal wires are disposed in respective regions having mutually different voltage drops in a power source voltage supplied to the plural MOS transistors. Out of the plural metal wires, the metal wires closest to the positions where the back gate bias circuits are disposed are connected to the back gate bias circuits.

A known semiconductor storage device includes a substrate biasing power source line that has a contact for supplying a substrate bias to the substrate, and that is provided close to the vicinity of a substrate bias generating circuit.

A known semiconductor integrated circuit device includes a circuit configuration that supplies an internal power source voltage from both outside and inside a semiconductor chip. In this semiconductor integrated circuit device, supply of the internal power source voltage from outside is performed through an internal power source pad, and supply of the internal power source voltage from inside is performed through a regulator.

RELATED PATENT DOCUMENTS

Japanese Laid-Open Patent Publication (JP-A) No. 2013-258266
JP-A No. S63-153852
JP-A No. 2006-351633

SUMMARY

According to an aspect of the embodiments, a semiconductor device includes: a plurality of circuits that are provided on a semiconductor substrate, and that each include a semiconductor element having a threshold voltage, the threshold voltage controlled by a substrate voltage supplied to the semiconductor substrate; a mesh-patterned first wiring that supplies each of the plurality of circuits with a power source voltage supplied to a plurality of locations at an outer periphery of the first wiring; a mesh-patterned second wiring that is provided at a wiring layer, and that receives a supply of the substrate voltage; and a mesh-patterned third wiring that is provided at a different wiring layer from the wiring layer at which the second wiring is provided, that has an outer periphery connected to an outer periphery of the second wiring, and that supplies the substrate voltage to the semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
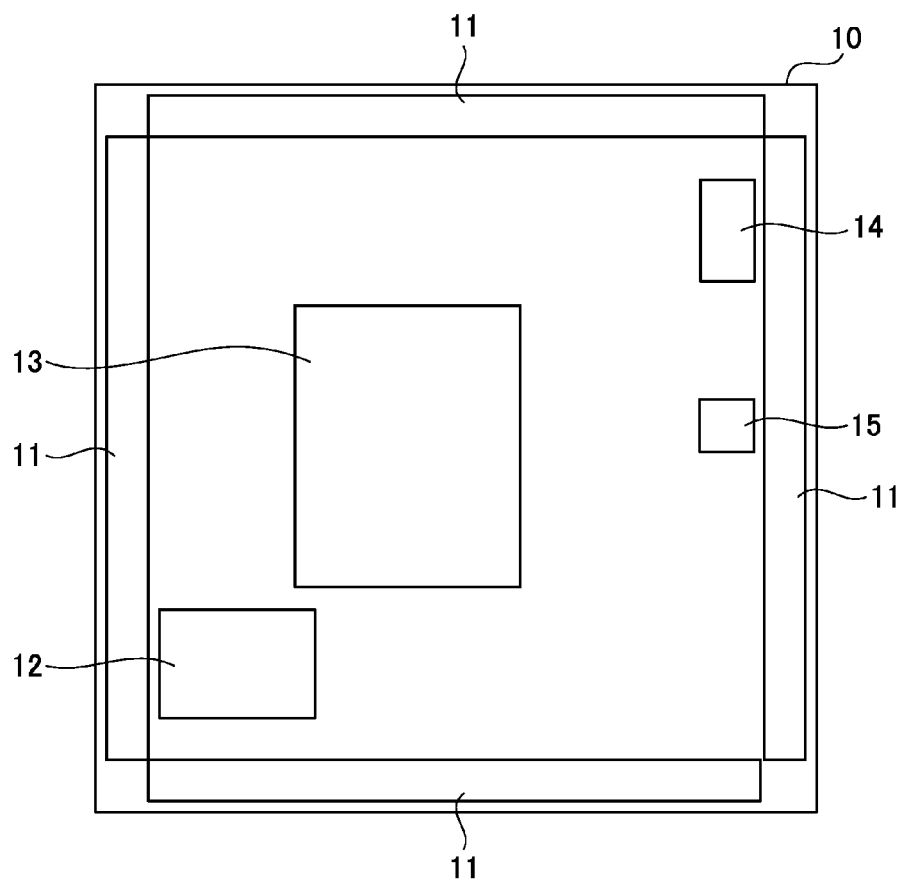
FIG. 1 is a diagram illustrating an example of a floor plan of a semiconductor device according to an exemplary embodiment of technology disclosed herein.

A back-biasing voltage is, for example, generated by a voltage generating circuit such as a charge pump formed inside a semiconductor device, and is supplied to various locations in the semiconductor substrate through wires (referred to as back-biasing wiring hereafter) from the voltage generating circuit. Voltage drop occurs along the back-biasing wiring since leak current flows to the semiconductor substrate accompanying the application of the back-biasing voltage. Namely, the back-biasing voltage supplied to the semiconductor substrate is lower the greater the distance from the connection point of the back-biasing wiring to the voltage generating circuit. The threshold voltages of semiconductor elements are normally higher the higher the absolute value of the back-biasing voltage, and the delay times of the semiconductor elements increase accordingly. The delay time of a semiconductor element disposed at a location where the distance from the connection point of the back-biasing wiring to the voltage generating circuit is relatively small is therefore longer than the delay time of a semiconductor element disposed at a location where the distance from the connection point of the back-biasing wiring to the voltage generating circuit is relatively large. Thus variation in delay time of the semiconductor elements disposed at various locations on the semiconductor substrate arises due to back-biasing voltage drops when the back-biasing voltage is supplied to various locations on the semiconductor substrate through the back-biasing wiring.

However, a power source voltage for driving the circuit that includes the semiconductor elements may, for example, be supplied from outside of the semiconductor chip through a terminal (pad) formed at the outer periphery of the semiconductor device. The power source voltage is supplied to circuits disposed at various locations on a semiconductor device through wires (referred to as power source wiring hereafter). Similarly to the back-biasing wiring, voltage drops occur along the power source wiring. Namely, the power source voltage gradually decreases toward the center of the semiconductor device. Normally, the delay times of the semiconductor elements are longer the lower the power source voltage, and the delay times of the semiconductor elements disposed at the center of the semiconductor device are longer than the delay times of the semiconductor elements disposed at the outer periphery of the semiconductor device. Thus variation in the delay times of the semiconductor elements that form circuits arises due to power source voltage drop when the power source voltage is supplied to the circuits disposed at various locations on the semiconductor device through the power source wiring.

When the distribution of the back-biasing voltage is unrelated to the distribution of the power source voltage, there is a concern of variation in delay times caused by power source voltage drops and variation in delay times caused by back-biasing voltage drops being additive, and variation in delay times becoming even longer.

Explanation follows regarding an example of an exemplary embodiment of technology disclosed herein, with reference to the drawings. Note that the same reference numerals are allocated to identical or equivalent configuration elements and sections in each of the drawings.

First Exemplary Embodiment

FIG. 1 is a diagram illustrating an example of a floor plan of a semiconductor device 10 according to an exemplary embodiment of technology disclosed herein. As an example, the semiconductor device 10 is configured as a rectangular semiconductor chip formed with an integrated circuit on a semiconductor substrate. The semiconductor device 10 includes input/output circuits (I/O circuits) 11 provided along the four external edges bordering the semiconductor device 10. As an example, the semiconductor device 10 also includes plural circuits such as a charge pump 12, a logic cell 13, static random access memory (SRAM) 14, and an analog macro 15, at the inside of the input/output circuits (I/O circuits) 11.

Figure 2:
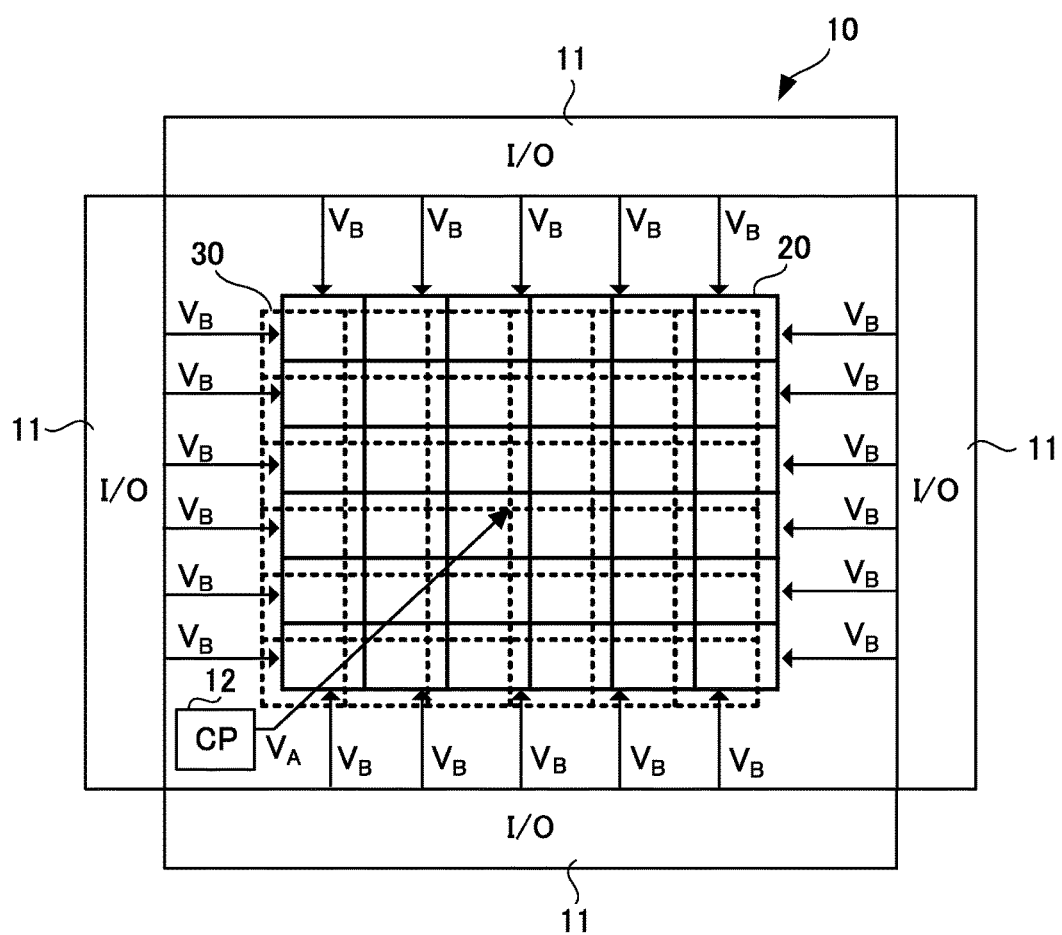
FIG. 2 is a diagram illustrating a wiring configuration of a semiconductor device according to an exemplary embodiment of technology disclosed herein.

FIG. 2 is a diagram illustrating a wiring configuration of the semiconductor device 10. The semiconductor device 10 includes power source wiring 20 illustrated by solid lines in FIG. 2, and back-biasing wiring 30 illustrated by dashed lines in FIG. 2. Plural wires of the power source wiring 20 and the back-biasing wiring 30 extend in mutually different directions, and are disposed so as to intersect with each other in a mesh (net) pattern that covers substantially the entire region inside the I/O circuits 11. The power source wiring 20 and the back-biasing wiring 30 are provided at mutually different wiring layers, and are isolated from each other.

A power source voltage $V_B$ is output from the input/output circuits (I/O circuits) 11 provided at the outer periphery of the semiconductor device 10, and is applied to plural locations at the outer periphery of the power source wiring 20. The power source voltage $V_B$ is supplied to the respective circuits 12 to 15 in the semiconductor device 10 (see FIG. 1), through the power source wiring 20.

The charge pump 12 is a voltage generating circuit that generates a back-biasing voltage $V_A$ for controlling the threshold voltage of respective semiconductor elements in the semiconductor device 10. The back-biasing voltage $V_A$ generated by the charge pump 12 is applied to a central portion of the back-biasing wiring 30, and is supplied to the semiconductor substrate through the back-biasing wiring 30.

Figure 3:
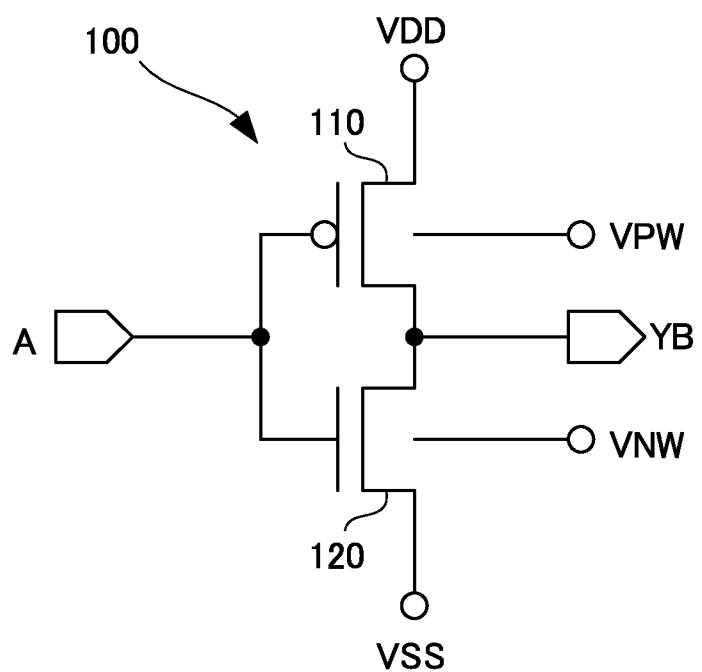
FIG. 3 is a diagram illustrating a configuration of a CMOS circuit according to an exemplary embodiment of technology disclosed herein.

The power source wiring 20 includes two wiring systems: high voltage side power source wiring (wires connected to a high voltage side power source terminal VDD illustrated in FIG. 3), and low voltage side power source wiring (wires connected to a low voltage side power source terminal VSS illustrated in FIG. 3). However, these are illustrated as one in FIG. 2 to avoid complicating the diagram. The back-biasing wiring 30 includes two wiring systems: wires that connect to a well of a P-MOS transistor (a back gate terminal VPW illustrated in FIG. 3), and wires connected to a well of an N-MOS transistor (a back gate terminal VNW illustrated in FIG. 3). However, these are illustrated as one in FIG. 2 to avoid complicating the diagram.

FIG. 3 is a diagram illustrating a configuration of a complementary metal oxide semiconductor (CMOS) circuit 100 that is an example of a circuit included in the semiconductor device 10. The CMOS circuit 100 may, for example, be formed inside the logic cell 13 illustrated in FIG. 1. The CMOS circuit 100 includes a P-MOS transistor 110 and an N-MOS transistor 120 connected to each other in series. The source of the P-MOS transistor 110 is connected to the high voltage side power source terminal VDD, and the drain is connected to the drain of the N-MOS transistor 120 and an output terminal YB of the CMOS circuit 100. The source of the N-MOS transistor 120 is connected to the low voltage side power source terminal VSS. The gates of the P-MOS transistor 110 and the N-MOS transistor 120 are connected to an input terminal A of the CMOS circuit 100. The back gate of the P-MOS transistor 110 (the N-well region) is connected to a back gate terminal VPW, and the back gate of the N-MOS transistor 120 (the P-well region) is connected to a back gate terminal VNW.

The power source voltage $V_B$ for driving the CMOS circuit 100 is supplied to the high voltage side power source terminal VDD and the low voltage side power source terminal VSS through the respective power source wiring 20 systems. The back-biasing voltage $V_A$ output from the charge pump 12 (see FIG. 2) is supplied to the back gate terminals VPW and VNW through the respective back-biasing wiring 30 systems. The threshold voltage of the P-MOS transistor 110 is controlled by a positive back-biasing voltage $V_A$ supplied to the back gate terminal VPW. The threshold voltage of the N-MOS transistor 120 is controlled by a negative back-biasing voltage $V_A$ supplied to the back gate terminal VNW.

In the following explanation, since the explanation includes both the positive and negative back-biasing voltages $V_A$, description relating to the voltage value of the back-biasing voltage $V_A$ refers to the absolute value of the back-biasing voltage $V_A$ where no particular distinction is made between positive and negative. Namely, in the case of the negative back-biasing voltage $V_A$, occurrence of a voltage drop in the back-biasing voltage $V_A$ refers to diminishing of the negative back-biasing voltage $V_A$.

Figure 4:
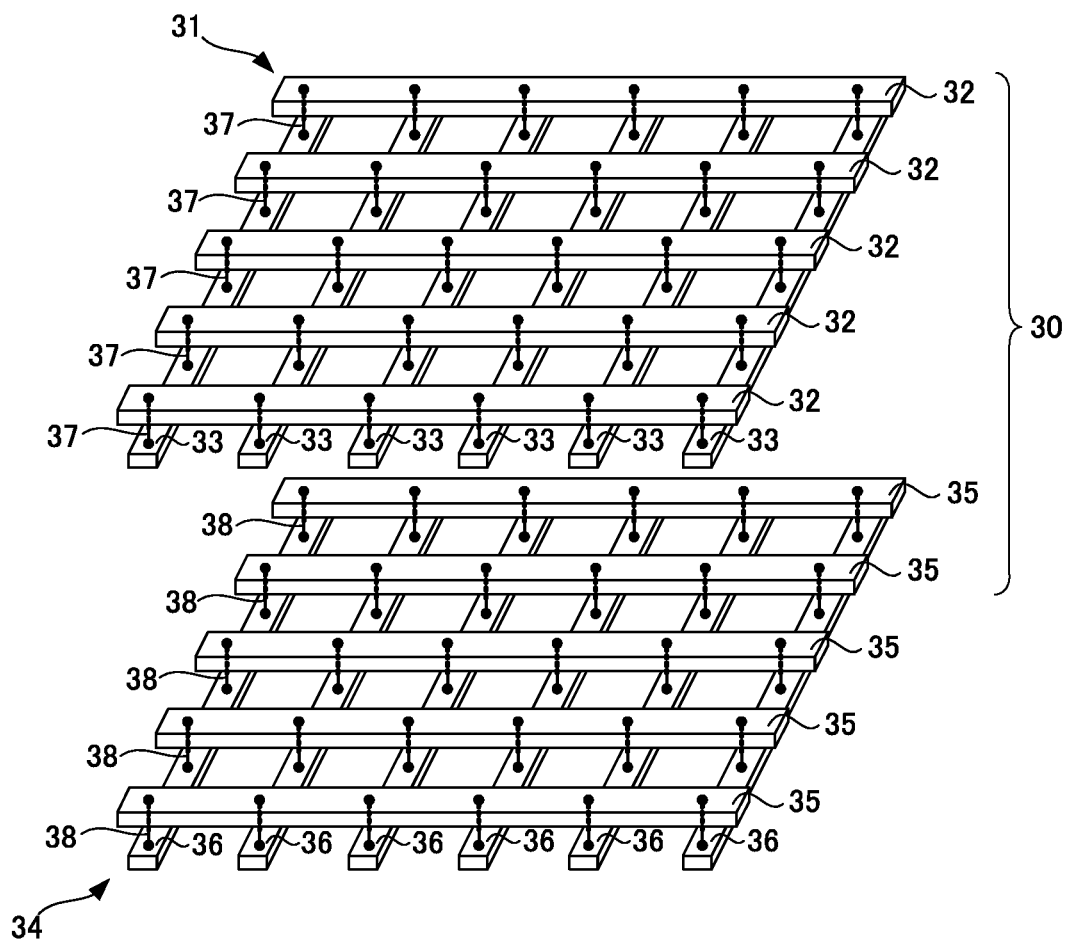
FIG. 4 is a perspective diagram illustrating a configuration of back-biasing wiring according to an exemplary embodiment of technology disclosed herein.

FIG. 4 is a perspective diagram illustrating a configuration of the back-biasing wiring 30 according to the exemplary embodiment of technology disclosed herein. The back-biasing wiring 30 includes upper layer mesh wiring 31, and lower layer mesh wiring 34 that is provided at a wiring layer that is a lower layer than the upper layer mesh wiring 31. Vias 39 (see FIG. 5) that connect the upper layer mesh wiring 31 to the lower layer mesh wiring 34 are omitted from illustration in FIG. 4 to avoid complicating the diagram.

The upper layer mesh wiring 31 includes plural wires 32 that extend in one direction, and plural wires 33 that extend in a direction intersecting with the wires 32. The wires 32 and the wires 33 are provided at different wiring layers, and are connected to each other by vias 37 provided at each point of intersection between the wires 32 and the wires 33. As illustrated in FIG. 4, the plural wires 32 and wires 33 form a mesh (net) patterned wiring network in the upper layer mesh wiring 31. Note that the wires 32 and the wires 33 may be integrally formed in the same wiring layer. In such cases the vias 37 are unnecessary.

Similarly, the lower layer mesh wiring 34 includes plural wires 35 extending in one direction, and plural wires 36 extending in a direction intersecting with the wires 35. The wires 35 and the wires 36 are provided at different wiring layers, and are connected to each other through vias 38 provided at each point of intersection between the wires 35 and the wires 36. As illustrated in FIG. 4, the plural wires 35 and wires 36 form a mesh (net) patterned wiring network in the lower layer mesh wiring 34. Note that the wires 35 and the wires 36 may be integrally formed in the same wiring layer. In such cases the vias 38 are unnecessary.

Figure 5:
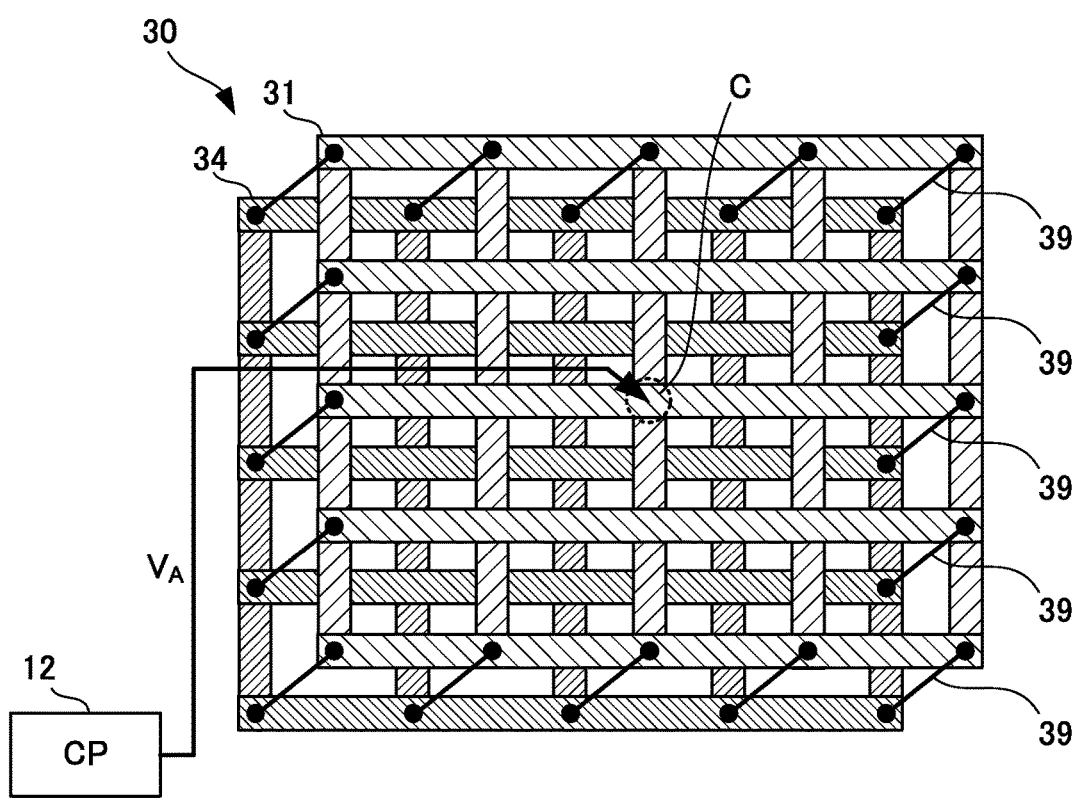
FIG. 5 is a diagram illustrating a connection mode between upper layer mesh wiring and lower layer mesh wiring according to an exemplary embodiment of technology disclosed herein.

FIG. 5 is a diagram illustrating a connection mode between the upper layer mesh wiring 31 and the lower layer mesh wiring 34. The upper layer mesh wiring 31 and the lower layer mesh wiring 34 extend across substantially the same range as each other on the semiconductor substrate, and are provided at positions overlapping with each other. The upper layer mesh wiring 31 and the lower layer mesh wiring 34 are connected together through plural vias 39 provided therebetween. The plural vias 39 each have one end connected to the outer periphery of the upper layer mesh wiring 31, and have another end connected to the outer periphery of the lower layer mesh wiring 34. Namely, the outer periphery of the upper layer mesh wiring 31 are connected to the outer periphery of the lower layer mesh wiring 34 through the plural vias 39. In the present exemplary embodiment, the plural vias 39 are disposed at uniform intervals around the outer peripheries of the upper layer mesh wiring 31 and the lower layer mesh wiring 34.

The back-biasing voltage $V_A$ generated by the charge pump 12 is preferably applied to a central portion C of the upper layer mesh wiring 31. The back-biasing voltage $V_A$ applied to the central portion C of the upper layer mesh wiring 31 is transmitted toward the outer periphery of the upper layer mesh wiring 31, and is further transmitted to the outer periphery of the lower layer mesh wiring 34 through the plural vias 39. The back-biasing voltage $V_A$ supplied to the outer periphery of the lower layer mesh wiring 34 is transmitted toward the peripheral inside of the lower layer mesh wiring 34. The semiconductor substrate configuring the semiconductor device 10 receives a supply of the back-biasing voltage $V_A$ from the lower layer mesh wiring 34.

Figure 6:
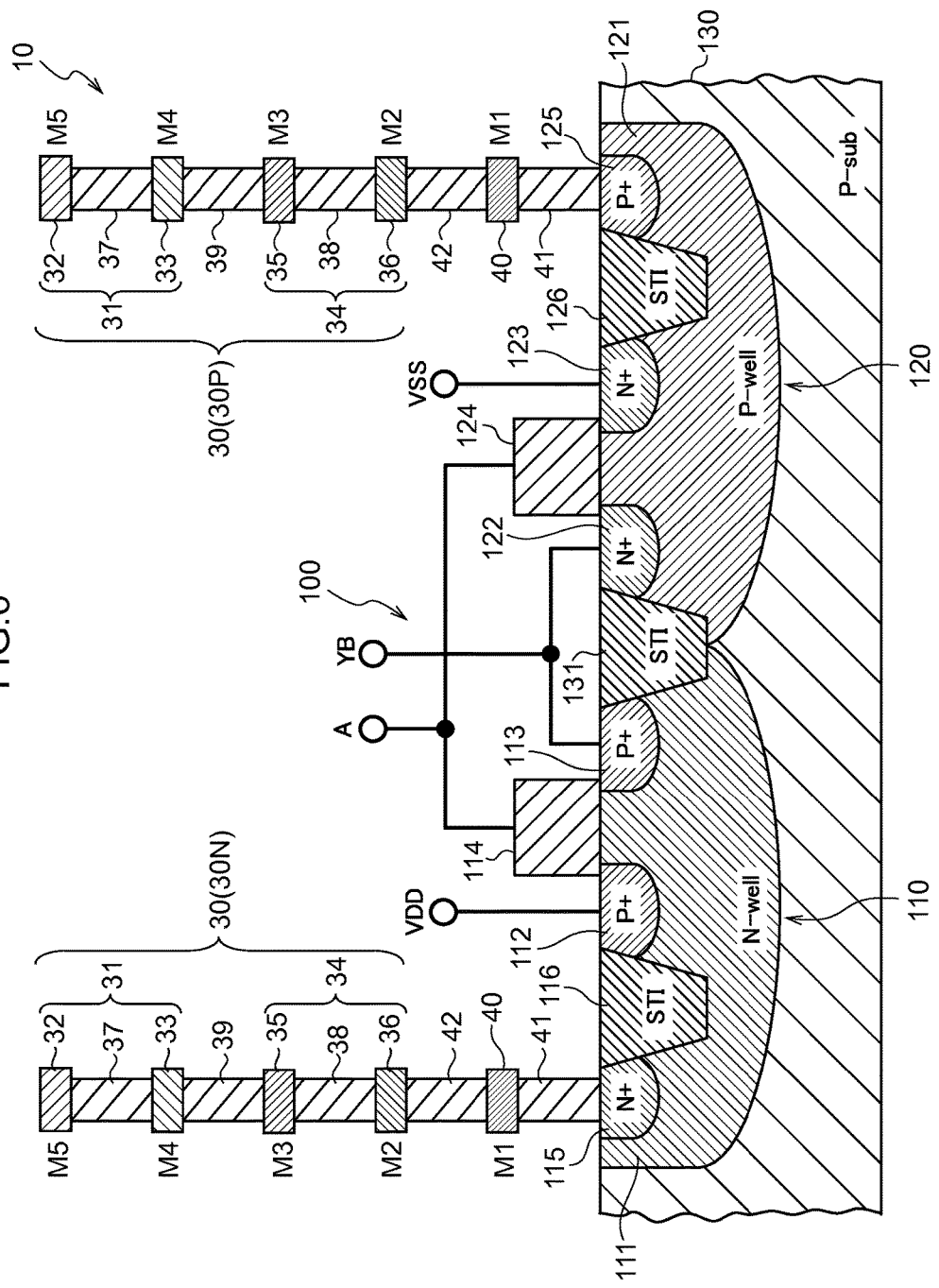
FIG. 6 is a cross-section diagram illustrating a partial configuration of a semiconductor device according to an exemplary embodiment of technology disclosed herein.

FIG. 6 is a cross-section diagram illustrating a partial configuration of the semiconductor device 10. In FIG. 6, as an example, configuration components are illustrated that correspond to the CMOS circuit 100 illustrated in FIG. 3.

The P-MOS transistor 110 configuring the CMOS circuit 100 is formed inside an n-well region 111 that is formed in the surface area of a p-type semiconductor substrate 130. P-type regions 112 and 113 that respectively configure the source and drain of the P-MOS transistor 110 are formed in the surface area of the n-well region 111. The p-type region 112 is connected to the high voltage side power source terminal VDD, and the p-type region 113 is connected to the output terminal YB of the CMOS circuit 100. A gate electrode 114 is provided above a channel region between the p-type regions 112 and 113. The gate electrode 114 is connected to the input terminal A of the CMOS circuit 100. An n-type region 115 that improves the electrical connection between the n-well region 111 and a via 41 is formed in the surface area of the n-well region 111. The n-type region 115 and the p-type region 112 are isolated from each other by a shallow trench isolation (STI) region 116 provided therebetween.

The N-MOS transistor 120 that configures the CMOS circuit 100 is formed in a p-well region 121 formed in the surface area of the semiconductor substrate 130. N-type regions 122 and 123 respectively configuring the drain and source of the N-MOS transistor 120 are formed in the surface area of the p-well region 121. The n-type region 122 is connected to the output terminal YB of the CMOS circuit 100, and the n-type region 123 is connected to the low voltage side power source terminal VSS. A gate electrode 124 is provided above a channel region between the n-type regions 122 and 123. The gate electrode 124 is connected to the input terminal A of the CMOS circuit 100. A p-type region 125 that improves the electrical connection between the p-well region 121 and a via 41 is formed in the surface area of the p-well region 121. The p-type region 125 and the n-type region 123 are isolated from each other by an STI region 126 provided therebetween. Moreover, the P-MOS transistor 110 and the N-MOS transistor 120 are isolated from each other by an STI region 131 provided therebetween.

The semiconductor device 10 includes plural wiring layers M1 to M5. Out of the wires configuring the back-biasing wiring 30, the upper layer mesh wiring 31 forms the wiring layers M5 and M4, and the lower layer mesh wiring 34 forms the wiring layers M3 and M2. More specifically, out of the wires configuring the upper layer mesh wiring 31, the wires 32 form the wiring layer M5, and the wires 33 form the wiring layer M4. The wires 32 and the wires 33 are connected to each other through the vias 37. Out of the wires configuring the lower layer mesh wiring 34, the wires 35 form the wiring layer M3, and the wires 36 form the wiring layer M2. The wires 35 and the wires 36 are connected to each other through the vias 38. The upper layer mesh wiring 31 and the lower layer mesh wiring 34 are connected to each other through the vias 39.

The back-biasing wiring 30 (30N) of a first system for supplying back-biasing voltage $V_A$ to the n-well region 111 is connected to the n-type region 115 through a via 42, a wire 40 and the via 41. Similarly, the back-biasing wiring 30 (30P) of a second system for supplying back-biasing voltage $V_A$ to the p-well region 121 is connected to the p-type region 125 through a via 42, the wire 40, and the via 41. Note that the power source wiring 20 is omitted from illustration in FIG. 6 to avoid complicating the diagram. The power source wiring 20 may be formed in a wiring layer other than the wiring layers M1 to M5.

Figure 7:
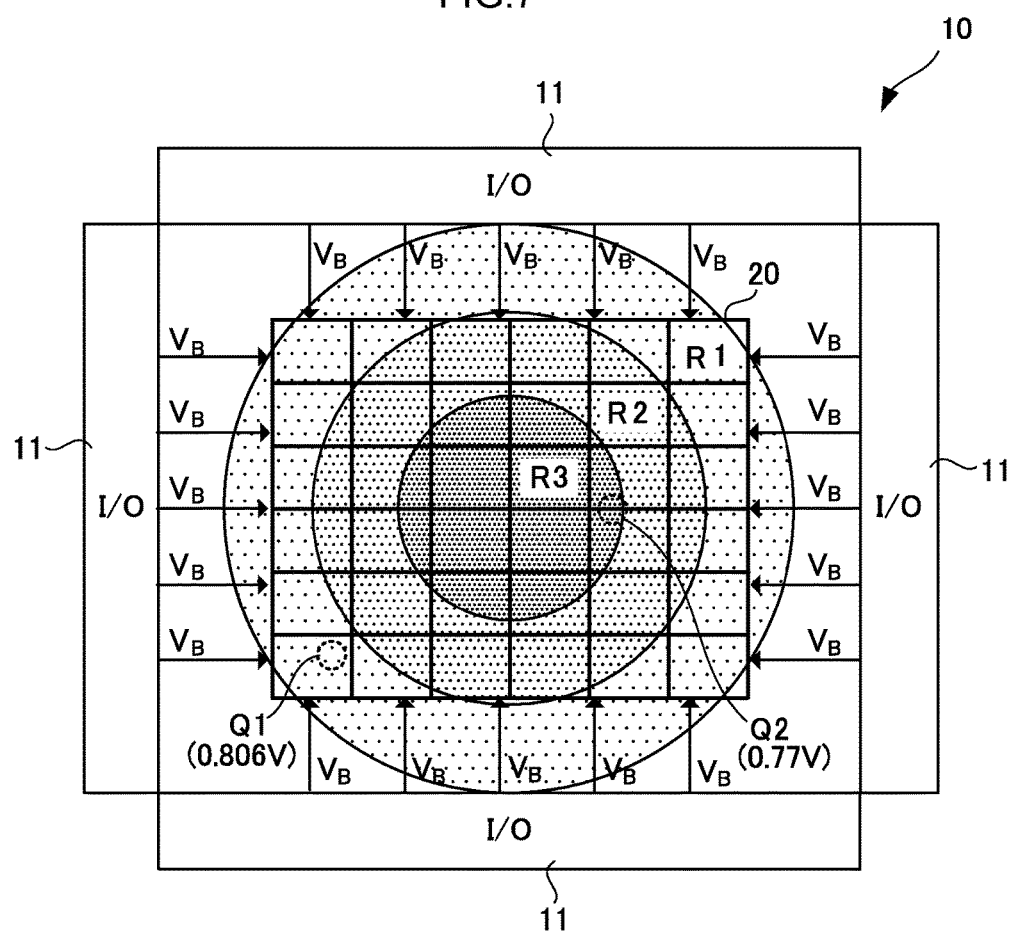
FIG. 7 is a diagram schematically illustrating a distribution in the magnitude of a power source voltage in a semiconductor device according to an exemplary embodiment of technology disclosed herein.

FIG. 7 is a diagram schematically illustrating a distribution of the magnitude of the power source voltage $V_B$ in the semiconductor device 10. The power source voltage $V_B$ is supplied to the power source wiring 20 through the input/output circuits (I/O circuits) 11 provided along each of the external edges bordering the semiconductor device 10. Namely, the power source voltage $V_B$ is supplied to the power source wiring 20 from plural locations at the outer periphery of the power source wiring 20. The power source voltage $V_B$ supplied to the outer periphery of the power source wiring 20 is transmitted toward the peripheral inside of the power source wiring 20. A voltage drop occurs along the power source wiring 20 since a leak current flows accompanying application of the power source voltage $V_B$ in each circuit configuring the semiconductor device 10. The drop in the power source voltage $V_B$ is greater the greater the distance from the outer periphery of the power source wiring 20. The distribution of the power source voltage $V_B$ in the semiconductor device 10 is illustrated in FIG. 7 by a grayscale gradient. A region R1 where the grayscale gradient is faint is a region where the voltage drop is relatively small, namely, the region R1 corresponds to a region where the magnitude of the power source voltage $V_B$ is relatively high in the semiconductor device 10. A region R3 where the grayscale gradient is dark is a region where the voltage drop is relatively large, namely, the region R3 corresponds to a region where the magnitude of the power source voltage $V_B$ is relatively low in the semiconductor device 10. The region R2 where the grayscale gradient is moderate is a region where the voltage drop is moderate, namely, the region R2 corresponds to a region where the magnitude of the power source voltage $V_B$ is moderate in the semiconductor device 10. As illustrated in FIG. 7, due to the voltage drop along the power source wiring 20, the power source voltage $V_B$ is relatively high at the outer periphery of the power source wiring 20, and becomes gradually smaller on progression toward the central portion of the power source wiring 20. When the power consumption by each of the circuits configuring the semiconductor device 10 is substantially uniform across the semiconductor substrate, the distribution of the power source voltage $V_B$ is concentric to the semiconductor device 10, as illustrated in FIG. 7. For example, the power source voltage $V_B$ is 0.806V at a location Q1 in the region R1, and is 0.77V at a location Q2 in the region R3.

Figure 8:
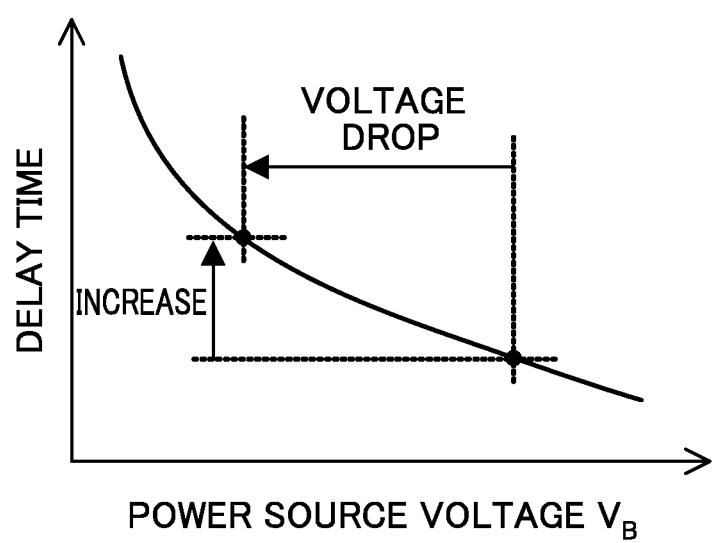
FIG. 8 is a diagram illustrating a relationship between a power source voltage and delay times in a semiconductor element.

FIG. 8 is a diagram illustrating a relationship between the power source voltage $V_B$ and the delay times of the semiconductor elements configuring each circuit of the semiconductor device 10. The delay times of the semiconductor elements exhibit a tendency to become longer the lower the power source voltage $V_B$. Namely, the delay time is extended when the power source voltage $V_B$ is decreases due to the voltage drop. Thus, considering power source voltage factors only, the delay times of the semiconductor elements are relatively short in the region R1 where the power source voltage $V_B$ is comparatively high (see FIG. 7), and the delay times of the semiconductor elements are relatively long in the region R3 where the power source voltage $V_B$ is relatively low (see FIG. 7). Namely, considering power source voltage factors only, the delay times of the semiconductor elements become longer on progression from portions corresponding to the outer periphery of the power source wiring 20 toward portions corresponding to the central portion of the power source wiring 20.

Figure 9:
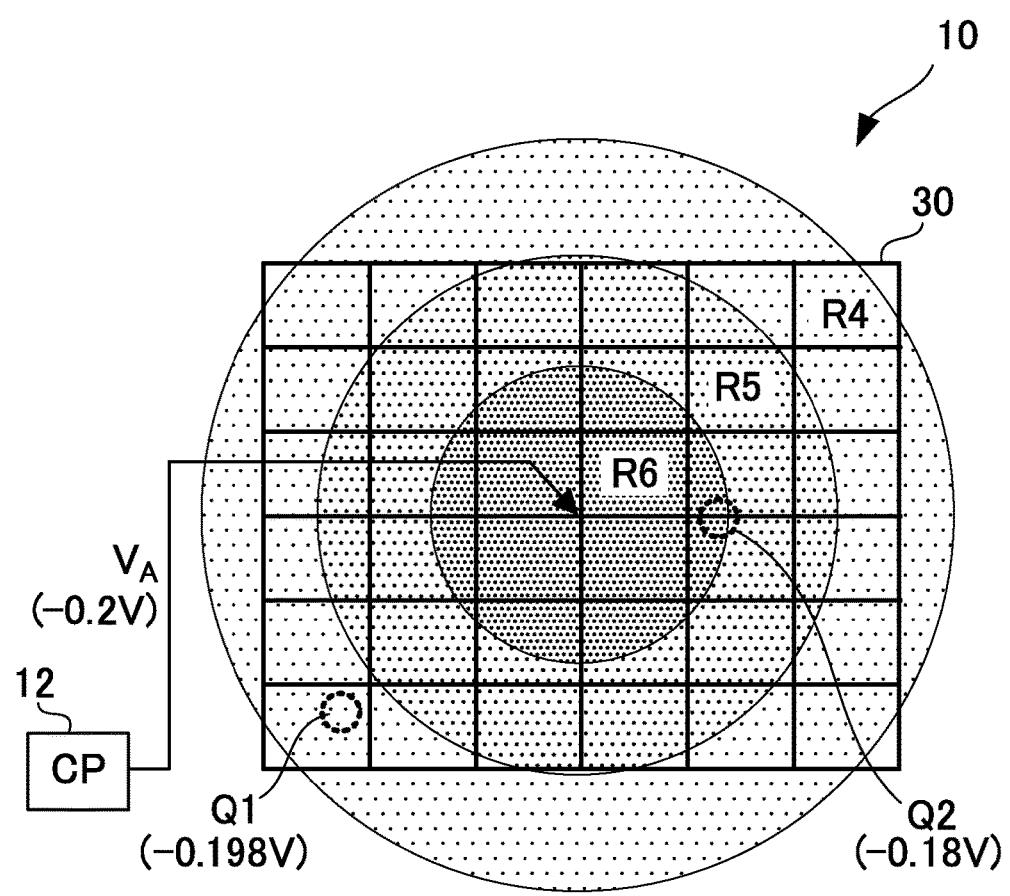
FIG. 9 is a diagram schematically illustrating a distribution of the magnitude of a back-biasing voltage in a semiconductor device according to an exemplary embodiment of technology disclosed herein.

FIG. 9 is a diagram schematically illustrating a distribution of the magnitude of the back-biasing voltage $V_A$ in the semiconductor device 10. Note that the upper layer mesh wiring 31 and the lower layer mesh wiring 34 are illustrated together, as the back-biasing wiring 30, in FIG. 9. A voltage drop occurs along the back-biasing wiring 30 since leak current flows in the semiconductor substrate accompanying application of the back-biasing voltage $V_A$ in the semiconductor device 10. The drop in back-biasing voltage $V_A$ becomes greater the greater the distance from the outer periphery of the lower layer mesh wiring 34. The distribution of the back-biasing voltage $V_A$ in the semiconductor device 10 is illustrated as a grayscale gradient in FIG. 9. A region R4 where the grayscale gradient is faint is a region where the voltage drop is relatively small, namely, the region R4 corresponds to a region where the magnitude of the back-biasing voltage $V_A$ is relatively high in the semiconductor device 10. A region R6 where the grayscale gradient is dark is a region where the voltage drop is relatively high, namely, the region R6 corresponds to a region where the magnitude of the back-biasing voltage $V_A$ is relatively high in the semiconductor device 10. A region R5 where the grayscale gradient is moderate is a region where the voltage drop is moderate, namely, the region R5 corresponds to a region where the magnitude of the back-biasing voltage $V_A$ is moderate in the semiconductor device 10. As illustrated in FIG. 9, due to the voltage drop along the back-biasing wiring 30, the back-biasing voltage $V_A$ is relatively high at the outer periphery of the back-biasing wiring 30, and becomes gradually smaller on progression toward the central portion of the back-biasing wiring 30 in the semiconductor device 10. Application of the back-biasing voltage $V_A$ output from the charge pump 12 to the central portion of the upper layer mesh wiring 31 enables the distribution of the back-biasing voltage $V_A$ to take on a concentric form as illustrated in FIG. 9. For example, when the negative back-biasing voltage output from the charge pump 12 is −0.2V, the back-biasing voltage $V_A$ is −0.198V at the location Q1 in the region R4, and the back-biasing voltage $V_A$ is −0.18V at the location Q2 in the region R6.

Figure 10:
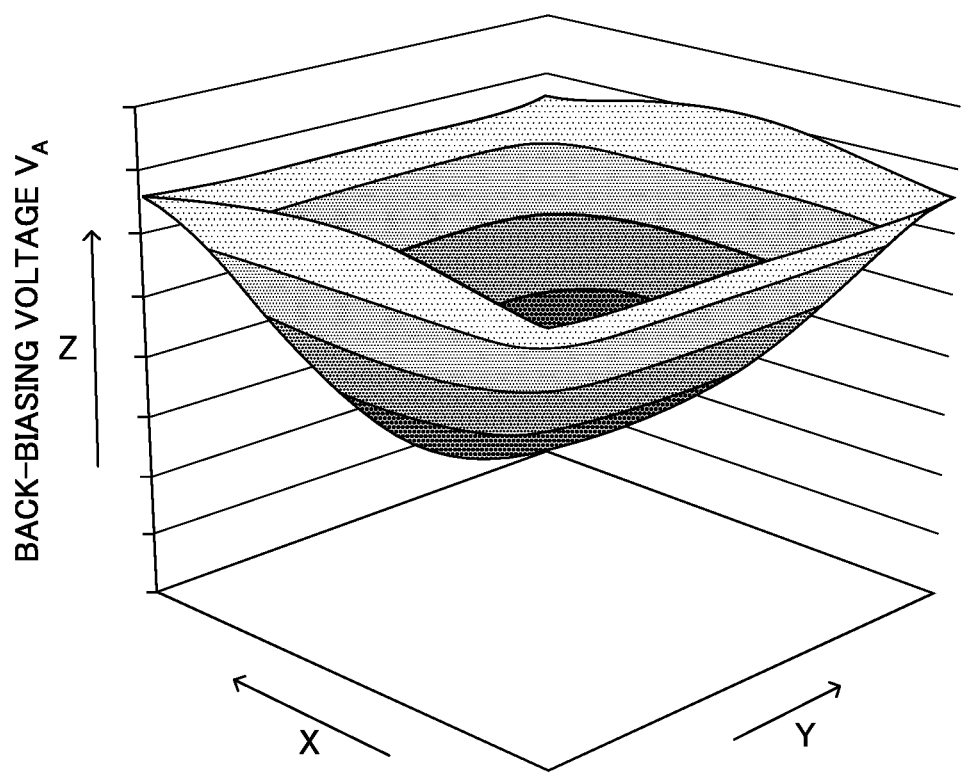
FIG. 10 is a diagram illustrating a result of using a simulation to find a distribution of the magnitude of a back-biasing voltage obtainable by back-biasing wiring according to an exemplary embodiment of technology disclosed herein.

FIG. 10 is a diagram illustrating the result of using a simulation to find the distribution of the magnitude of the back-biasing voltage $V_A$ obtained using the back-biasing wiring 30 according to the exemplary embodiment of technology disclosed herein. In FIG. 10, the x-axis and the y-axis represent positions on the main face of the semiconductor substrate, and the z-axis represents the magnitude of the back-biasing voltage $V_A$. As illustrated in FIG. 10, the simulation verifies that the back-biasing voltage $V_A$ becomes gradually lower on progression toward the central portion of the semiconductor substrate (namely, the central portion of the back-biasing wiring 30) in the configuration of the back-biasing wiring 30 according to the exemplary embodiment of technology disclosed herein.

Figure 11:
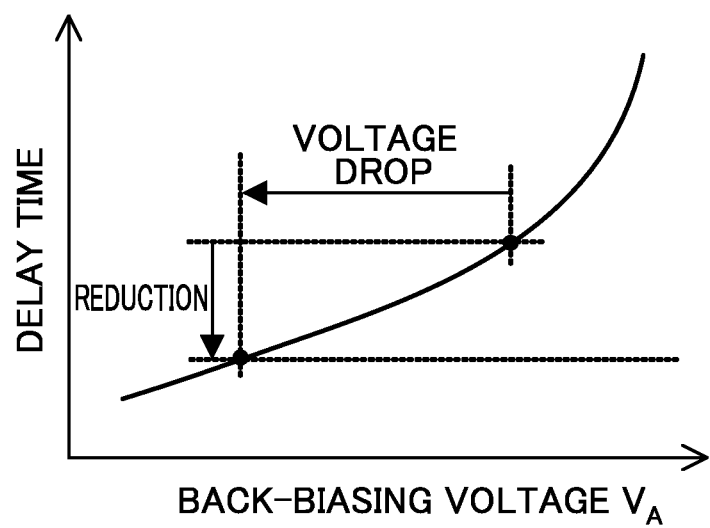
FIG. 11 is a diagram illustrating a relationship between back-biasing voltage and delay times of a semiconductor element.

FIG. 11 is a diagram illustrating a relationship between the back-biasing voltage $V_A$ and the delay times of the semiconductor elements configuring each circuit in the semiconductor device 10. The delay times of the semiconductor elements exhibit a tendency to become shorter the lower the back-biasing voltage $V_A$. Namely, the delay times are reduced when the back-biasing voltage $V_A$ decreases due to the voltage drop. Thus, considering only back-biasing voltage factors, the delay times of the semiconductor elements are relatively long at the region R4 where the back-biasing voltage $V_A$ is relatively high (see FIG. 9), and the delay times of the semiconductor elements are relatively short at the region R6 where the back-biasing voltage $V_A$ is relatively low (see FIG. 9). Namely, considering only back-biasing voltage factors, the delay times of the semiconductor elements become shorter on progression from the portion corresponding to the outer periphery to the portion corresponding to the central portion in the back-biasing wiring 30.

As is apparent when comparing FIG. 7 and FIG. 9, a distribution trend is exhibited in which the power source voltage $V_B$ and the back-biasing voltage $V_A$ both gradually decrease in voltage on progression from the outer periphery toward the central portion of the semiconductor device 10. Aligning the two voltage distribution trends in this manner enables the region R1, where the delay times caused by power source voltage factors are relatively short, to be aligned with the region R4, where the delay times caused by back-biasing voltage factors are relatively long. Moreover, the region R3, where the delay times caused by power source voltage factors are relatively long, can be aligned with the region R6, where the delay times caused by back-biasing voltage factors are relatively short. Variation in the delay times caused by the drop in the power source voltage $V_B$ is accordingly cancelled out by variation in the delay times caused by the drop in the back-biasing voltage $V_A$. As a result, variation in the delay times is suppressed when both factors relating to the power source voltage $V_B$ and the back-biasing voltage $V_A$, are added together.

Figure 12:
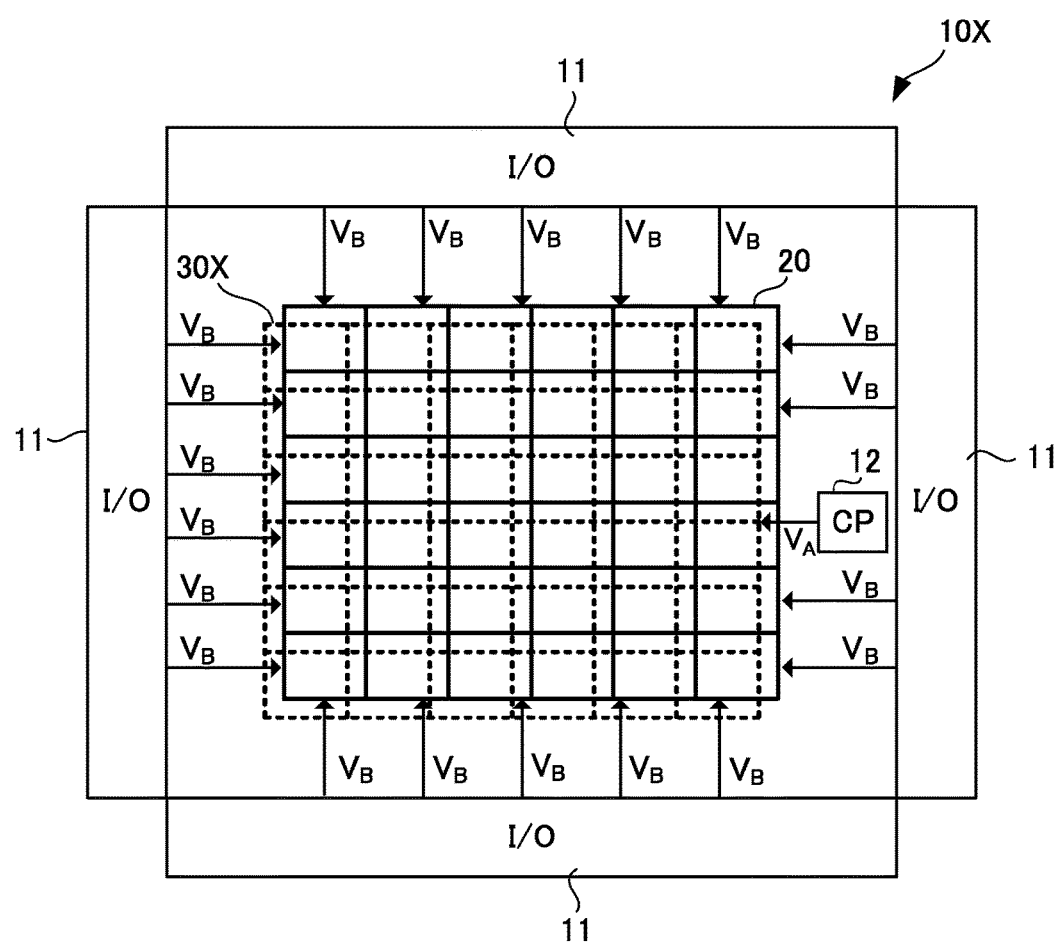
FIG. 12 is a diagram illustrating a wiring configuration of a semiconductor device according to a comparative example.

FIG. 12 is a diagram illustrating a wiring configuration of a semiconductor device 10X according to a comparative example. Note that configuration elements in FIG. 12 the same as or corresponding to those of the semiconductor device 10 according to the exemplary embodiment of technology disclosed herein are allocated the same reference numerals, and duplication explanation is omitted thereof. Back-biasing wiring 30X of the semiconductor device 10X according to the comparative example is configured with simple mesh-patterned wiring that does not have a multi-layered structure. Namely, rather than a configuration combining upper layer mesh wiring and lower layer mesh wiring, the back-biasing wiring 30X has a configuration similar to just one out of these. Moreover, in the semiconductor device 10X according to the comparative example, the back-biasing voltage $V_A$ output from the charge pump 12 is applied to a single point at the outer periphery (a right edge of the back-biasing wiring 30X in the example of FIG. 12), rather than to a central portion of the back-biasing wiring 30X. Note that the configuration of the power source wiring 20 in the semiconductor device 10X according to the comparative example is similar to the power source wiring 20 in the semiconductor device 10 according to the exemplary embodiment of technology disclosed herein. The power source voltage $V_B$ is output from an input/output circuit (I/O circuit) 11 provided along the external edge of the semiconductor device 10X according to the comparative example, and is applied to plural locations at the outer periphery of the power source wiring 20.

Figure 13A:
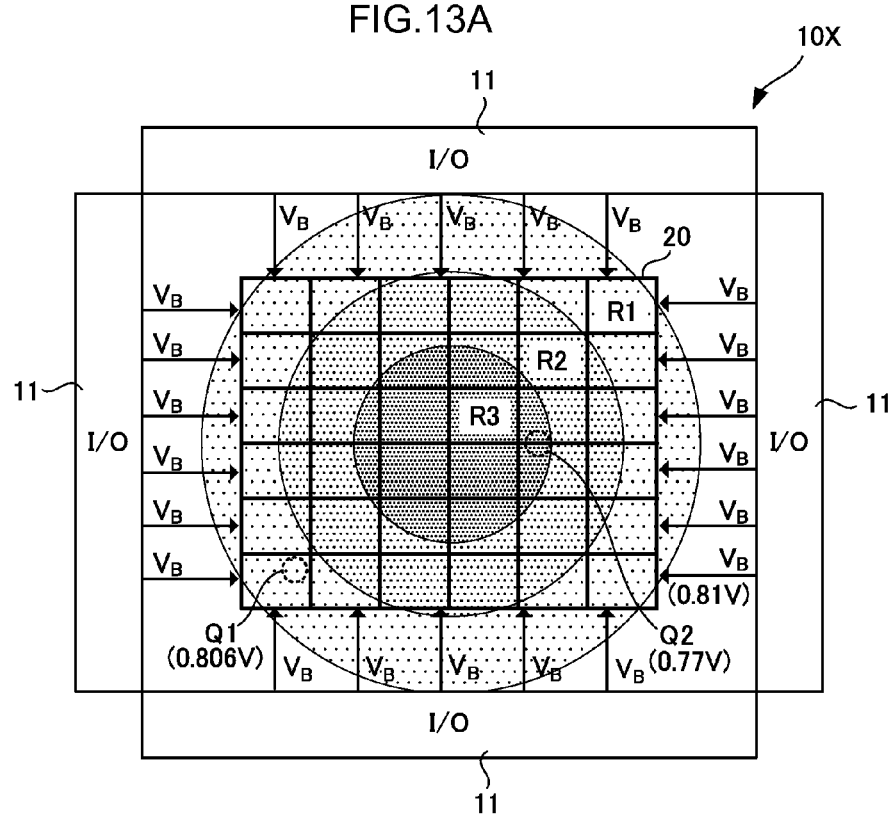
FIG. 13A is a diagram schematically illustrating a distribution of the magnitude of a power source voltage in a semiconductor device according to a comparative example.

FIG. 13A is a diagram schematically illustrating the distribution of the magnitude of the power source voltage $V_B$ in the semiconductor device 10X according to the comparative example. The distribution of the power source voltage $V_B$ is illustrated by a grayscale gradient in the FIG. 13A. A region R1 where the grayscale gradient is faint is a region where the voltage drop is relatively small, namely, the region R1 corresponds to a region where the magnitude of the power source voltage $V_B$ is relatively high. A region R3 where the grayscale gradient is dark is a region where the voltage drop is relatively large, namely, the region R3 corresponds to a region where the magnitude of the power source voltage $V_B$ is relatively low. A region R2 where the grayscale gradient is moderate is a region where the voltage drop is moderate, namely, the region R2 corresponds to a region where the magnitude of the power source voltage $V_B$ is moderate. As illustrated in FIG. 13A, similarly to in the semiconductor device 10 according to the exemplary embodiment of technology disclosed herein, in the semiconductor device 10X according to the comparative example also, the power source voltage $V_B$ is relatively high at the outer periphery of the power source wiring 20, and becomes gradually lower on progression toward the central portion of the power source wiring 20. For example, the power source voltage $V_B$ is 0.806V at a location Q1 in the region R1, and is 0.77V at a location Q2 in the region R3.

Figure 13B:
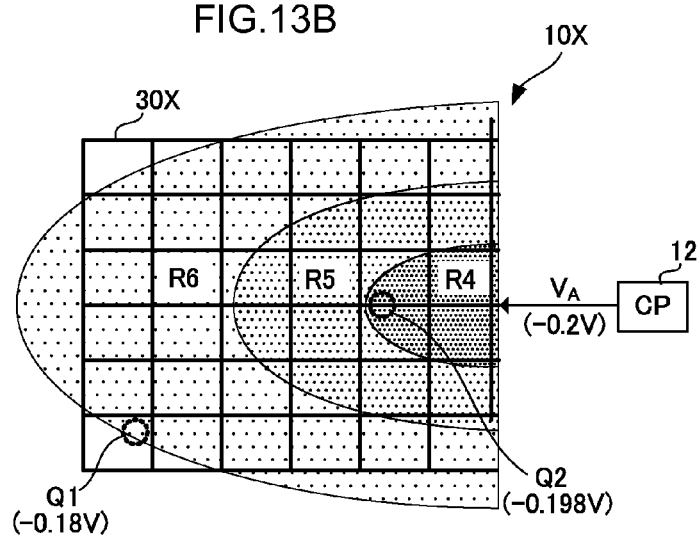
FIG. 13B is a diagram schematically illustrating a distribution of the magnitude of a back-biasing voltage in a semiconductor device according to a comparative example.

FIG. 13B schematically illustrates the distribution of the magnitude of the back-biasing voltage $V_A$ in the semiconductor device 10X according to the comparative example. The distribution of the back-biasing voltage $V_A$ is illustrated as a grayscale gradient in FIG. 13B. A region R4 where the grayscale gradient is faint is a region where the voltage drop is relatively small, namely, the region R4 corresponds to a region where the magnitude of the back-biasing voltage $V_A$ is relatively high. A region R6 where the grayscale gradient is dark is a region where the voltage drop is relatively large, namely, the region R3 corresponds to a region where the magnitude of the back-biasing voltage $V_A$ is relatively low. A region R5 where the grayscale gradient is moderate is a region where the voltage drop is moderate, namely, the region R5 corresponds to a region where the magnitude of the back-biasing voltage $V_A$ is moderate. The drop in the back-biasing voltage $V_A$ is greater the greater the distance from the point where the back-biasing voltage $V_A$ is applied in the back-biasing wiring 30X according to the comparative example having a simple mesh structure. Namely, as illustrated in FIG. 13B, in cases in which the back-biasing voltage $V_A$ output from the charge pump 12 is applied to the right edge of the back-biasing wiring 30X, the back-biasing voltage $V_A$ gradually decreases on progression from the right edge of the back-biasing wiring 30X toward the left edge. For example, the negative back-biasing voltage $V_A$ is −0.198V at the location Q2 in the region R4, and is −0.18V at the location Q1 in the region R6.

As is apparent when comparing FIG. 13A and FIG. 13B, the distribution trend in the power source voltage $V_B$ and the distribution trend in the back-biasing voltage $V_A$ are not aligned in the semiconductor device 10X according to the comparative example. Namely, the region R1, where the delay times caused by power source voltage factors are relatively short, is not aligned with the region R4, where the delay times caused by back-biasing voltage factors are relatively long. Moreover, the region R3, where the delay times caused by power source voltage factors are relatively long, is not aligned with the region R6, where the delay times caused by back-biasing voltage factors are relatively short. Thus the semiconductor device 10X according to the comparative example is not able to obtain the advantageous effect of cancelling out the variation in the delay times caused by the drop in the power source voltage $V_B$ using the variation in the delay times caused by the drop in the back-biasing voltage $V_A$.

Moreover, in the semiconductor device 10X according to the comparative example, for example, locations like the location Q1 can arise where the region R1, where the delay times caused by power source voltage factors are relatively short, overlap with the region R6, where the delay times caused by back-biasing voltage factors are relatively short. Moreover, locations can arise like the location Q2 where the region R3, where the delay times caused by power source voltage factors are relatively long, overlap with the region R4, where the delay times caused by back-biasing voltage factors are relatively long. This results in the variation in the delay times caused by power source voltage factors being added to the variation in the delay times caused by back-biasing voltage factors, and the variation in the delay times becoming further extended, in the semiconductor device 10X according to the comparative example.

The delay times at the location Q1 and location Q2 illustrated in FIG. 13A and FIG. 13B in the semiconductor device 10X according to the comparative example were estimated using simulation. The results are explained below.

Figure 14:
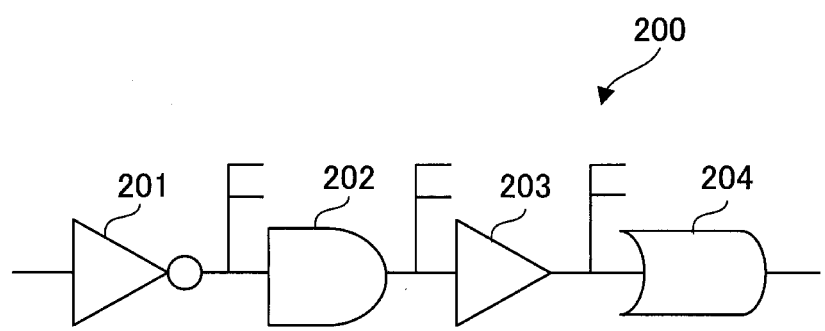
FIG. 14 is a diagram illustrating a configuration of a logic circuit subject to simulation.

FIG. 14 is a diagram illustrating a configuration of a logic circuit 200 subject to simulation. The logic circuit 200 is configured including plural logic gates 201 to 204 connected to one another in series. Simulation was used to estimate the delay times when the power source voltage $V_B$ and the back-biasing voltage $V_A$ at the location Q1 and the location Q2 are supplied to the logic circuit 200.

The magnitude of the power source voltage $V_B$ applied to the outer periphery of the power source wiring 20 was set at 0.81V as a condition of the simulation. The magnitude of the back-biasing voltage $V_A$ applied to a right edge portion of the back-biasing wiring 30X was set at −0.2V. The drop in the power source voltage $V_B$ at the location Q1 was estimated at 4 mV. Namely, the magnitude of the power source voltage $V_B$ at the location Q1 was estimated at 0.806V (see FIG. 13A). The drop in the back-biasing voltage $V_A$ at the location Q1 was estimated at 20 mV. Namely, the magnitude of the back-biasing voltage $V_A$ at the location Q1 was estimated at −0.18V (see FIG. 13B).

The drop in the power source voltage $V_B$ at the location Q2 was estimated at 40 mV. Namely, the magnitude of the power source voltage $V_B$ at the location Q2 was estimated at 0.77V (see FIG. 13A). The drop in the back-biasing voltage $V_A$ at the location Q2 was estimated at 2 mV. Namely, the magnitude of the back-biasing voltage $V_A$ at the location Q2 was estimated at −0.198V (see FIG. 13B).

The result of the simulation was that the delay time in the logic circuit 200 at the location Q1 ($V_B$=0.806V, $V_A$=−0.18V) was estimated at 1685 picoseconds. Moreover, the delay time in the logic circuit 200 at the location Q2 ($V_B$=0.77V, $V_A$=−0.198V) was estimated at 1911 picoseconds. Accordingly, the variation width of the delay times in the logic circuit 200 (the minimum value subtracted from the maximum value) was estimated at 226 picoseconds in the semiconductor device 10X according to the comparative example.

The delay times at the locations Q1 and Q2 illustrated in FIG. 7 and FIG. 9 were acquired by similar simulation for the semiconductor device 10 according to the exemplary embodiment of technology disclosed herein also, and the results are explained below. Note that the positions of the locations Q1 and Q2 illustrated in FIG. 7 and FIG. 9 correspond to the positions of the locations Q1 and Q2 illustrated in FIG. 13A and FIG. 13B, respectively. As the circuit subject to simulation, the logic circuit 200 illustrated in FIG. 14 was employed similarly to in the case of the comparative example described above.

Similarly to in the case of the comparative example described above, the magnitude of the power source voltage $V_B$ applied to the outer periphery of the power source wiring 20 was set at 0.81V as a condition of the simulation. The magnitude of the back-biasing voltage $V_A$ applied to the central portion of the back-biasing wiring 30 was set at −0.2V. The drop in the power source voltage $V_B$ at the location Q1 was estimated at 4 mV. Namely, the magnitude of the power source voltage $V_B$ at the location Q1 was estimated at 0.806V (see FIG. 7). The drop in the back-biasing voltage $V_A$ at the location Q1 was estimated at 2 mV. Namely, the magnitude of the back-biasing voltage $V_A$ at the location Q1 was estimated at −0.198V (see FIG. 9).

The drop in the power source voltage $V_B$ at the location Q2 was estimated at 40 mV. Namely, the magnitude of the power source voltage $V_B$ at the location Q2 was estimated at 0.77V (see FIG. 7). The drop in the back-biasing voltage $V_A$ at the location Q2 was estimated at 20 mV. Namely, the magnitude of the back-biasing voltage $V_A$ at the location Q2 was estimated at −0.18V.

As a result of the simulation, the delay time of the logic circuit 200 at the location Q1 ($V_B$=0.806V, $V_A$=−0.198V) was estimated at 1743 picoseconds. The delay time of the logic circuit 200 at the location Q2 ($V_B$=0.77V, $V_A$=−0.18V) was estimated at 1854 picoseconds. Accordingly, the variation width in the delay times of the logic circuit 200 (the minimum value subtracted from the maximum value) was estimated at 111 picoseconds in the semiconductor device 10 according to the exemplary embodiment of technology disclosed herein.

Namely, the semiconductor device 10 according to the exemplary embodiment of technology disclosed herein can obtain a compression effect of 115 picoseconds compared to the variation width of the delay times in the semiconductor device 10X according to the comparative example (226 picoseconds). In other words, the semiconductor device 10 according to the exemplary embodiment of technology disclosed herein can reduce the variation width of the delay times to substantially half of that in the semiconductor device 10X according to the comparative example.

Figure 15:
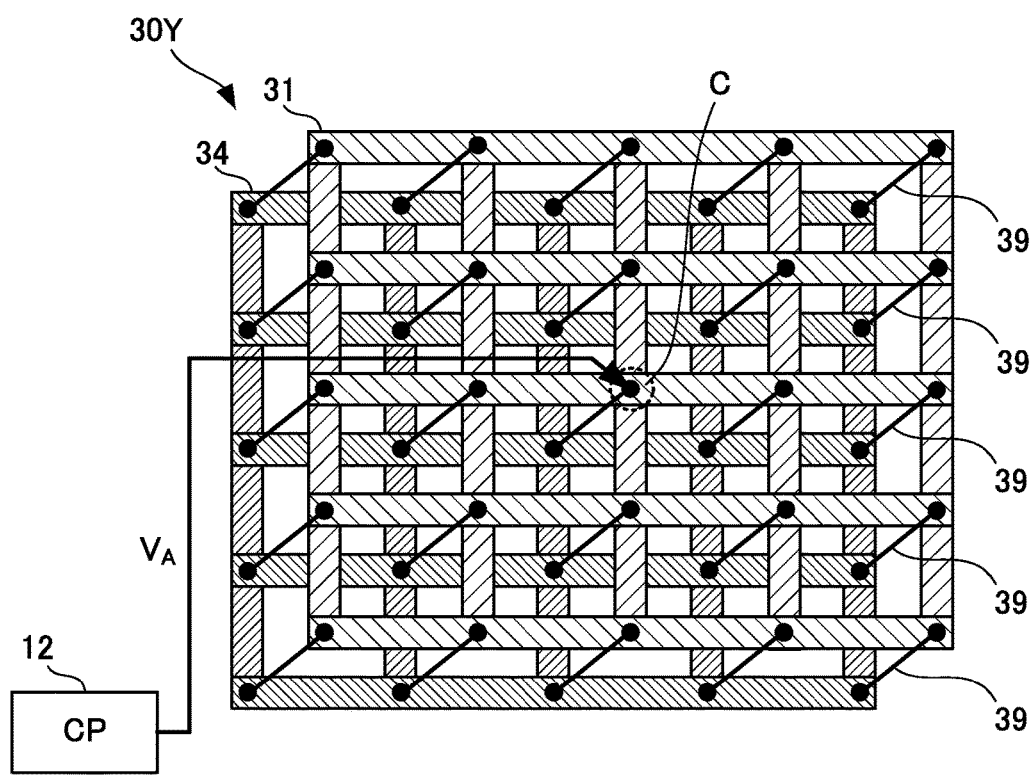
FIG. 15 is a diagram illustrating a configuration of back-biasing wiring according to a comparative example.

FIG. 15 is a diagram illustrating a configuration of back-biasing wiring 30Y according to a second comparative example. The back-biasing wiring 30Y according to the second comparative example includes upper layer mesh wiring 31 and lower layer mesh wiring 34 similarly to the back-biasing wiring 30 of the exemplary embodiment of technology disclosed herein. The back-biasing wiring 30Y according to the second comparative example differs from the back-biasing wiring 30 according to the exemplary embodiment of technology disclosed herein in that vias 39, which connect the upper layer mesh wiring 31 to the lower layer mesh wiring 34, are provided over the entire region of the peripheral inside, and not just at the outer periphery of the wiring. The back-biasing voltage $V_A$ output from the charge pump 12 is applied to a central portion C of the upper layer mesh wiring 31.

Figure 16:
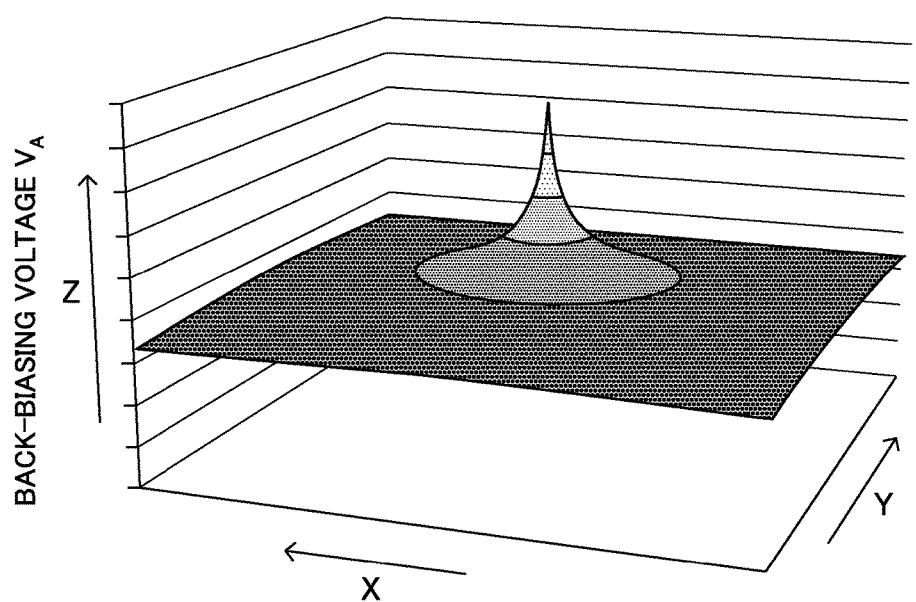
FIG. 16 is a diagram illustrating a result of using simulation to find a distribution of the magnitude of a back-biasing voltage obtainable by back-biasing wiring according to a comparative example.

FIG. 16 is a diagram illustrating the result of using a simulation to find the distribution of the magnitude of the back-biasing voltage $V_A$ obtained using the back-biasing wiring 30Y according to the second comparative example. In FIG. 16, the x-axis and the y-axis represent positions on the main face of the semiconductor substrate, and the z-axis represents the magnitude of the back-biasing voltage $V_A$. As illustrated in FIG. 16, the back-biasing voltage $V_A$ in the configuration of the back-biasing wiring 30Y according to the second comparative example has a distribution that is flat overall but includes a sharp peak at the central portion of the semiconductor substrate. Namely, in cases in which the connections between the upper layer mesh wiring 31 and the lower layer mesh wiring 34 are made across substantially the entirety of the wirings, the distribution trend of the back-biasing voltage $V_A$ does not align with the distribution trend of the power source voltage $V_B$. Thus the configuration of the back-biasing wiring 30Y according to the second comparative example is not able to obtain the advantageous effect of cancelling out the variation in the delay times caused by the drop in the power source voltage $V_B$ using the variation in the delay times caused by the drop in the back-biasing voltage $V_A$.

However, in the back-biasing wiring 30 according to the exemplary embodiment of technology disclosed herein, the connections between the upper layer mesh wiring 31 and the lower layer mesh wiring 34 are made at the outer periphery of the wirings only. As illustrated in FIG. 10, this enables the back-biasing voltage $V_A$ to form a distribution in which the back-biasing voltage $V_A$ gradually becomes smaller on progression toward the central portion of the semiconductor substrate. The distribution trend of the back-biasing voltage $V_A$ can thereby be aligned with the distribution trend of the power source voltage $V_B$, and the variation in the delay times caused by the drop in the power source voltage $V_B$ can be cancelled out by the variation in the delay times caused by the drop in the back-biasing voltage $V_A$.

As is made clear in the above explanation, the back-biasing wiring 30 includes the upper layer mesh wiring 31 and the lower layer mesh wiring 34 that are provided at different wiring layers from each other in the semiconductor device 10 according to the exemplary embodiment of technology disclosed herein. The upper layer mesh wiring 31 and the lower layer mesh wiring 34 are connected to each other through the plural vias 39 connected at the outer peripheries thereof. The back-biasing voltage $V_A$ output from the charge pump 12 is applied to the central portion of the upper layer mesh wiring 31, and transmitted to the lower layer mesh wiring 34 through the vias 39. Configuring the back-biasing wiring 30 in this manner enables the distribution trend of the back-biasing voltage $V_A$ to be substantially aligned with the distribution trend of the power source voltage $V_B$. The variation in the delay times caused by the drop in the power source voltage $V_B$ can thereby be nullified by the variation in the delay times caused by the drop in the back-biasing voltage $V_A$. As a result, variation in the delay times combining factors of both the power source voltage $V_B$ and the back-biasing voltage $V_A$ can be suppressed.

Second Exemplary Embodiment

Figure 17A:
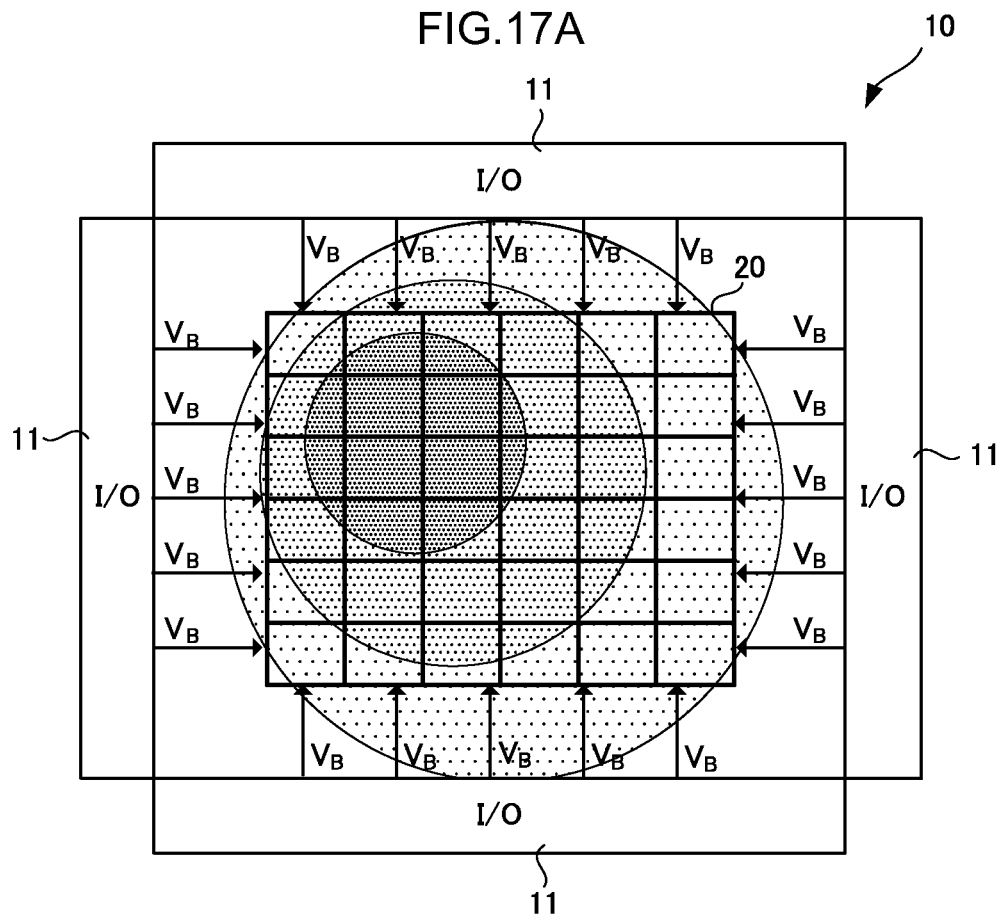
FIG. 17A is a diagram illustrating a state in which skew arises in a distribution of a power source voltage.

FIG. 17A is a diagram illustrating a state in which skew arises in distribution of the power source voltage $V_B$. FIG. 17A illustrates an example of a case in which a region exists in which the power source voltage $V_B$ is relatively low, at the position offset from the center point of the power source wiring 20 to the upper-left direction. Such skew in the distribution of the power source voltage $V_B$ can occur in cases in which the power consumption of the respective circuits supplied with the power source voltage $V_B$ is non-uniform on the semiconductor substrate. Namely, the drop in the power source voltage $V_B$ becomes large in regions where the power consumption is relatively high, and the power source voltage $V_B$ becomes low in these regions, causing skew to arise in the distribution of the power source voltage $V_B$.

Figure 17B:
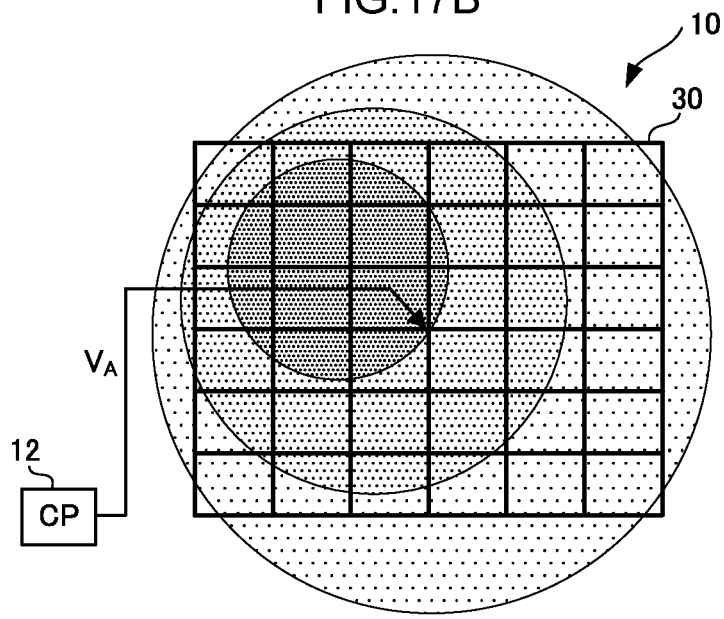
FIG. 17B is a diagram illustrating a state in which a distribution in a back-biasing voltage is made to correspond to skew in a distribution of a power source voltage.

Even when such skew arises in the distribution of the power source voltage $V_B$, as illustrated in FIG. 17B, coordinating the distribution trend of the back-biasing voltage $V_A$ with the distribution trend of the power source voltage $V_B$ enables variation in the delay times to be suppressed similarly to in the case of the first exemplary embodiment.

Figure 18:
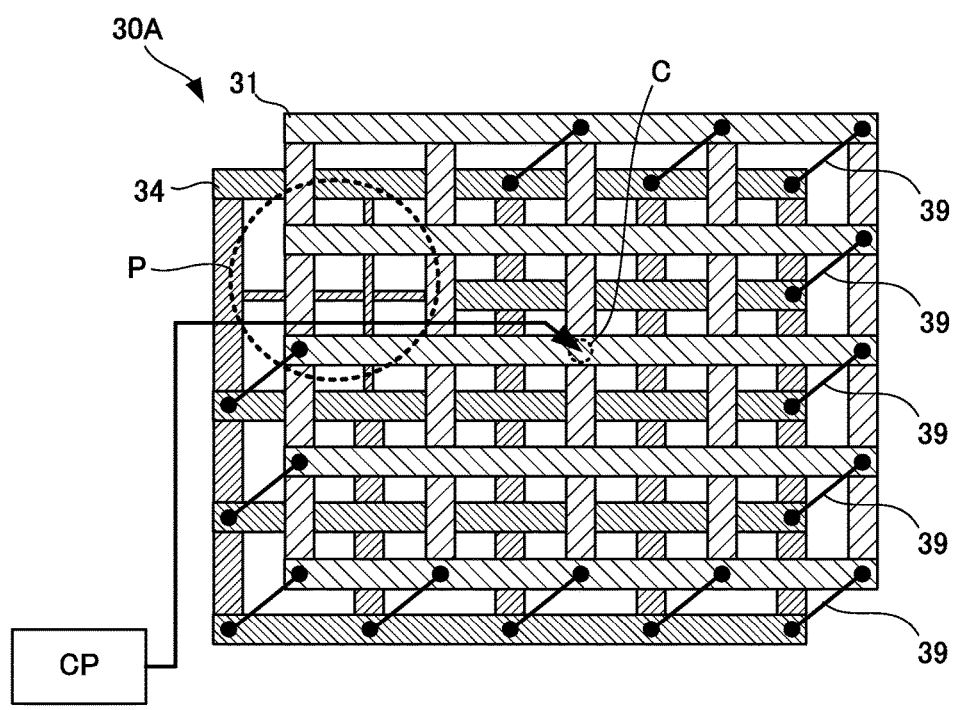
FIG. 18 is a diagram illustrating a configuration of back-biasing wiring according to a second exemplary embodiment of technology disclosed herein.

FIG. 18 is a diagram illustrating a configuration of back-biasing wiring 30A according to the second exemplary embodiment of technology disclosed herein. As an example, the back-biasing wiring 30A illustrated in FIG. 18 has a configuration for forming a distribution of the back-biasing voltage $V_A$ in which skew arises like that illustrated in FIG. 17B. The back-biasing wiring 30A includes upper layer mesh wiring 31 and lower layer mesh wiring 34, and the upper layer mesh wiring 31 and the lower layer mesh wiring 34 are connected to each other through plural vias 39 connected at the outer peripheries thereof. The back-biasing voltage $V_A$ output from the charge pump 12 is applied to a central portion C of the upper layer mesh wiring 31.

The vias 39 are thinned at a portion of the back-biasing wiring 30A corresponding to a region P where the power consumption by circuits supplied with the power source voltage $V_B$ is relatively high. Setting the density of via formation in the portion corresponding to the region P where the power consumption is relatively high is lower than the density of via formation at other portions in this manner enables the drop in the back-biasing voltage $V_A$ in the region P to be made large. Namely, this enables the back-biasing voltage $V_A$ to form a distribution in which skew like that illustrated in FIG. 17B is arises.

Moreover, as illustrated in FIG. 18, the wiring width of the lower layer mesh wiring 34 in the portion corresponding to the region P where the power consumption is relatively high may be made smaller than the wiring width at portions corresponding to regions where the power consumption is relatively small in the back-biasing wiring 30A. The drop in the back-biasing voltage $V_A$ at the region P can thereby be made large, and enabling the back-biasing voltage $V_A$ to form a distribution in which skew arises as illustrated in FIG. 17B, by locally reducing the wiring width. The distribution trend in the back-biasing voltage $V_A$ can be coordinated with the distribution trend in the power source voltage $V_B$ by configuring the back-biasing wiring 30 such that the drop in the back-biasing voltage $V_A$ is relatively large in the portion corresponding to the region where the power consumption is relatively high in this manner. Measures to adjust the formation density of the vias 39 as described above or measures to adjust the wiring width of the lower layer mesh wiring 34 may be applied singly, or the two may be employed in combination.

The configuration of the back-biasing wiring 30A according to the second exemplary embodiment enables the skew in the distribution of the power source voltage $V_B$ to be handled since skew can be added to the distribution of the back-biasing voltage $V_A$. Thus even when skew arises in the distribution of the power source voltage $V_B$, variation in the delay times caused by the drop in the power source voltage $V_B$ can be nullified by variation in the delay times caused by the drop in the back-biasing voltage $V_A$, and variation in the delay times can be suppressed.

Figure 19:
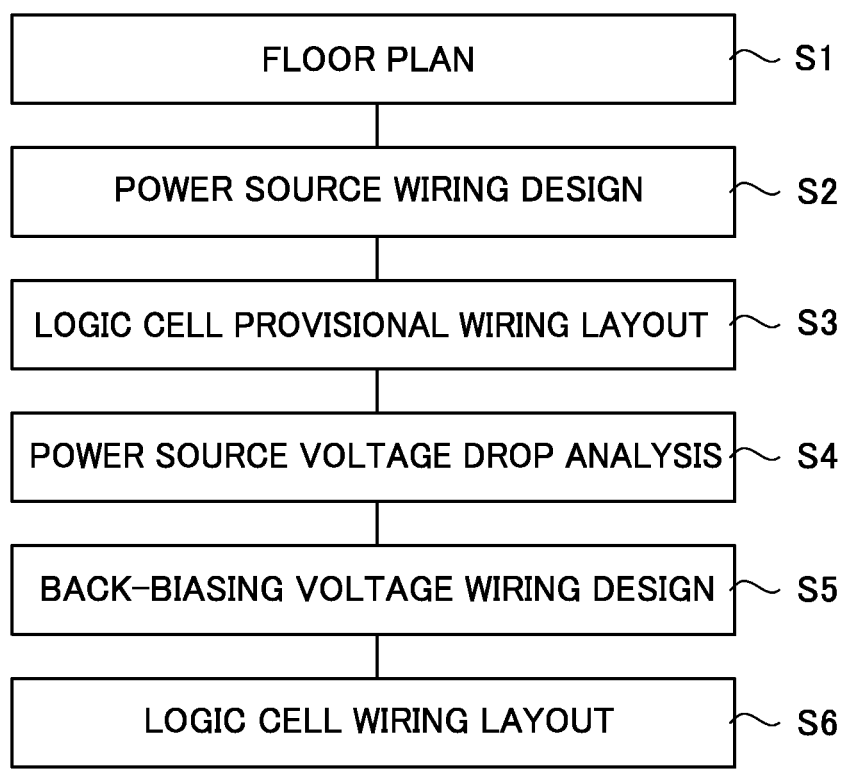
FIG. 19 is a process diagram illustrating a design procedure for a semiconductor device in cases in which a distribution trend in a back-biasing voltage is made to correspond to a distribution trend in a power source voltage according to an exemplary embodiment of technology disclosed herein.

FIG. 19 is a process diagram illustrating a design procedure for the semiconductor device 10 when the distribution trend of the back-biasing voltage $V_A$ is aligned with the distribution trend of the power source voltage $V_B$.

A floor plan is implemented at step S1. Namely, the approximate layout of each circuit block configuring the semiconductor device 10 is determined. Design of the power source wiring 20 is performed at step S2. Namely, wiring is designed for supplying the power source voltage $V_B$ to each circuit block disposed at step S1. Provisional wiring layout of logic cells is performed at step S3. An approximate state of the drop in the power source voltage $V_B$ is thereby determined, and an approximate distribution in the power source voltage $V_B$ is determined. Analysis of the drop in the power source voltage $V_B$ is performed at step S4. At this step, regions where the drop in the power source voltage $V_B$ is relatively large and regions where the drop in the power source voltage $V_B$ is relatively small are found, and the distribution of the power source voltage $V_B$ is discovered, using a simulation, for example. At step S5 design of the back-biasing wiring 30 is performed. At this step, the back-biasing wiring 30 is designed such that the distribution trend in the power source voltage $V_B$ that was discovered by analyzing the drop in the power source voltage $V_B$ is aligned with the distribution trend in the back-biasing voltage $V_A$. More specifically, in cases in which there is skew in the distribution of the power source voltage $V_B$, measures are taken such that, for example, in the portions corresponding to regions where the power source voltage $V_B$ is relatively small, the formation density of the vias 39 is made relatively low, and the wiring width is made relatively small. Logic cell wiring layout is performed at step S6. Performing each process according to the above procedure enables the semiconductor device 10 to be designed such that the distribution trend in the back-biasing voltage $V_A$ is aligned with the distribution trend in the power source voltage $V_B$.

In each of the exemplary embodiments above, explanations have been given of cases in which the back-biasing voltage $V_A$ is generated by the charge pump 12 provided inside the semiconductor device 10; however, the back-biasing voltage $V_A$ may be supplied from outside of the semiconductor device 10. In such cases also, the distribution of the back-biasing voltage $V_A$ can be made to take on a concentric form as illustrated in FIG. 9 by configuring such that the back-biasing voltage $V_A$ is applied to the central portion of the upper layer mesh wiring 31.

The power source wiring 20 corresponds to first wiring of technology disclosed herein. The upper layer mesh wiring 31 corresponds to second wiring of technology disclosed herein. The lower layer mesh wiring 34 corresponds to third wiring of technology disclosed herein. The semiconductor substrate 130, the n-well region 111, and the p-well region 121 correspond to a semiconductor substrate of technology disclosed herein. The logic cell 13, the SRAM 14, and the analog macro 15 correspond to circuits of technology disclosed herein. The power source voltage $V_B$ corresponds to a power source voltage of technology disclosed herein. The back-biasing voltage $V_A$ corresponds to a substrate voltage of technology disclosed herein. The charge pump 12 corresponds to a voltage generation section of technology disclosed herein.

An aspect of technology disclosed herein exhibits the advantageous effect of enabling variation in delay times of semiconductor elements to be suppressed in a semiconductor device having wiring for supplying a substrate voltage that controls semiconductor element threshold voltages to various locations on the semiconductor substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a plurality of circuits that are provided on a semiconductor substrate, and that each include a semiconductor element having a threshold voltage, the threshold voltage controlled by a substrate voltage supplied to the semiconductor substrate;
   a mesh-patterned first wiring that is formed by arranging a plurality of wirings extending in mutually different directions so as to intersect with each other, and that supplies each of the plurality of circuits with a power source voltage supplied to a plurality of locations at an outer periphery of the first wiring;
   a mesh-patterned second wiring that is formed by arranging a plurality of wirings extending in mutually different directions so as to intersect with each other, and that is provided at a wiring layer, and that receives a supply of the substrate voltage; and
   a mesh-patterned third wiring that is formed by arranging a plurality of wirings extending in mutually different directions so as to intersect with each other, and that is provided at a different wiring layer from the wiring layer at which the second wiring is provided, that has an outer periphery connected to an outer periphery of the second wiring, and that supplies the substrate voltage received from the second wiring to the semiconductor substrate.

2. The semiconductor device of claim 1, wherein the substrate voltage is supplied to a central portion of the second wiring.

3. The semiconductor device of claim 1, wherein the second wiring and the third wiring are configured such that a drop in an absolute value of the substrate voltage in a portion corresponding to a first region, where power consumption by circuits of the plurality of circuits is relatively high in the semiconductor device, is greater than a drop in an absolute value of the substrate voltage in a portion corresponding to a second region, where power consumption by circuits of the plurality of circuits is less than in the first region.

4. The semiconductor device of claim 3, wherein:
the outer peripheries of the second wiring and the third wiring are connected to each other through a plurality of vias; and
a formation density of vias of the plurality of vias in the portion corresponding to the first region is lower than a formation density of vias of the plurality of vias in the portion corresponding to the second region.

5. The semiconductor device of claim 3, wherein, in the third wiring, a wiring width at the portion corresponding to the first region is less than a wiring width at the portion corresponding to the second region.

6. The semiconductor device of claim 1, further comprising a voltage generation section that generates the substrate voltage.

7. The semiconductor device of claim 1, wherein the outer peripheries of the second wiring and the third wiring are connected to each other through a plurality of vias.

8. The semiconductor device of claim 7, wherein the plurality of vias are disposed at uniform intervals.

9. The semiconductor device of claim 1, wherein the third wiring is not connected to the second wiring except at the outer periphery of the second wiring.

* * * * *